United States Patent [19]

Renner et al.

[11] Patent Number: 4,700,323
[45] Date of Patent: Oct. 13, 1987

[54] DIGITAL LATTICE FILTER WITH MULTIPLEXED FULL ADDER

[75] Inventors: Karl H. Renner, Dallas; Alec J. Morton, Plano, both of Tex.

[73] Assignee: Texas Instruments Incorporated, Dallas, Tex.

[21] Appl. No.: 646,868

[22] Filed: Aug. 31, 1984

[51] Int. Cl.⁴ .................... G06F 15/31; G10L 1/00
[52] U.S. Cl. ................................ 364/724; 381/51
[58] Field of Search ............... 364/724, 760; 381/51

[56] References Cited

U.S. PATENT DOCUMENTS

| | | | |
|---|---|---|---|
| 4,209,844 | 6/1980 | Brantingham et al. | 364/724 |
| 4,319,084 | 3/1982 | Lucchini et al. | 381/51 |
| 4,340,781 | 7/1982 | Ichikawa et al. | 364/724 |
| 4,344,148 | 8/1982 | Brantingham et al. | 364/724 |
| 4,352,162 | 9/1982 | Nyuji et al. | 364/724 |
| 4,392,018 | 7/1983 | Fette | 381/51 |
| 4,398,262 | 8/1983 | Williams | 364/724 |
| 4,443,859 | 4/1984 | Wiggins | 364/724 |
| 4,554,858 | 11/1985 | Wachi et al. | 364/724 |
| 4,597,053 | 6/1986 | Chamberlin | 364/760 |

FOREIGN PATENT DOCUMENTS

2103458  2/1983  United Kingdom ................ 381/51

Primary Examiner—David H. Malzahn
Attorney, Agent, or Firm—Leo N. Heiting; N. Rhys Merrett; Melvin Sharp

[57] ABSTRACT

A system for processing a plurality of Equations includes a single full adder (44) which has the A input thereof multiplexed by multiplexer (62) and the B input thereof multiplexed by a multiplexer (94) and a multiplexer (66). The multiplexer (94) is operable to select a multiplicand for multiplication operations from a delay stack (54) for multiplication operations. The multiplication operation is performed by adding together partial products recording to Booth's modified algorithm. The partial products are generated by recode logic circuit (90) and (98). The recode logic circuits (90) and (98) are controlled by the multiplexed output from the multiplexer (80) which selects bits of a given multiplier stored in a K-stack (72). The multiplexer (62) in conjunction with the recode logic circuits (90) and (98) control reconfiguration of the adder (44) as a multiplication circuit. The addition operation is performed on the generated product by circulating the product back to the B-input of the adder (44) through the multiplexer (66). Data is selected from the output of a data stack (52) or from a D-register (108) which contains a prestored output value.

20 Claims, 5 Drawing Figures

DIGITAL LATTICE FILTER WITH MULTIPLEXED FULL ADDER

TECHNICAL FIELD OF THE INVENTION

The present invention pertains in general to processing arithmetic operations and, more particularly, to processing arithmetic operations in a digital lattice filter with the use of binary full adders for speech synthesis.

CROSS REFERENCE TO RELATED APPLICATION

This application is related to patent application Ser. No. 646,381, filed Aug. 31, 1984, patent application Ser. No. 646,869, filed Aug. 31, 1984, patent application Ser. No. 646,606, filed Aug. 31, 1984, and patent application Ser. No. 646,401, filed Aug. 31, 1984.

BACKGROUND OF THE INVENTION

Generation of complex synthesized sounds such as speech require some form of voice compression. One voice compression technique that has been heretofore utilized is linear predictive coding (LPC). LPC utilizes a digital lattice filter to model human speech from a set of prestored input parameters contained in a Read Only Memory (ROM). The LPC lattice filter typically is comprised of ten stages with each stage requiring two multiplications and two additions before passing the results backwards and forwards to its neighboring stages. The operations in the ten stages are carried out sequentially, as are the four operations within each stage. Processing of each prestored input parameter through the lattice filter results in a digital output value which is converted to an analog signal level and then amplified free output to a speaker or similar transducer.

In order to synthesize high quality speech with a digital lattice filter, it is necessary to process the prestored input parameters through the lattice filter at a repetition rate of approximately 10 KHz. To operate the lattice filter at this repetition rate, each stage must perform the operations therein in approximately 10 microseconds. Addition or subtraction of two values is a relatively straight forward process, whereas multiplication of two values is somewhat more complicated as it requires iterative processing which may require up to four separate additions, depending upon the length of the digital values multiplied. The processing of the two multiplications and two additions for each stage will therefore require the generation of up to ten sums.

Heretofore, the two multiplications and two additions for each stage have been performed in a parallel fashion with five sums being simultaneously performed. In this manner, circuitry with a relatively slow response time can be utilized. However, to perform this parallel operation, five full adders are necessary which is a disadvantage in that a significant amount of silicon surface area is required in order to realize the circuitry for five full adders. From a cost and manufacturing standpoint, it would be desirable to utilize less circuitry to perform the same operation. Therefore, there exists a need for a circuit to perform the arithmetic operations in each stage of the digital filter which requires less circuitry without sacrificing processing time.

SUMMARY OF THE INVENTION

The present invention disclosed and claimed herein comprises a method and apparatus for performing a sequence of arithmetic operations at a high speed with a minimum of circuitry. The apparatus includes a full adder having first and second inputs for receiving two digital values and providing the sum thereof. A storage medium is provided for storage of multipliers and multiplicands for multiplication operations and addends for addition operations. The full adder can be configured for either multiplication or addition. The multiplication and addition operations are multiplexed such that only a single adder is required. Multiplication with the adder requires fetching of the multiplier and multiplicand and the generation of partial products. The partial products are then added with the adder according to a predetermined algorithm and the product is added to the addends to yield a result for the arithmetic operation.

In another embodiment of the present invention, a series of the sequential arithmetic operations are performed. The parameters for each of the operations in this series are stored in a first-in first-out stack configuration and incremented by a timing circuit. For each operation, the parameters are fetched and the multiplication and addition operations performed. The result is then stored in a temporary latch and the next operation initiated. The stored result constitutes either the multiplicand or the addend for a successive one of the arithemetic operation. Processing the arithmetic operations in the given sequence yields a final result which is stored in a data register for output therefrom.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Speech synthesis utilizing a ten stage lattice filter requires processing of a prestored value through all ten stages of the lattice filter within a predetermined duration of time. Each stage of the lattice filter has two sets of Equations, one for generating the "Y" value and the other for calculating the reflection coefficient or "B" value. Both the Y-and B-values are calculated with Equations consisting of one multiplication step followed by an addition or subtraction step. There are twenty separate Equations required to calculate all of the Y-and B-values, each Equation depending upon the results from a previous Equation. These Equations are illustrated in Table 1.

TABLE 1

| | |
|---|---|
| $Y10_i = EI_i - k10 b10_{i-1}$ | (1) |
| $Y9_i = Y10_i - k9 b9_{i-1}$ | (2) |
| $Y8_i = Y9_i - k8 b8_{i-1}$ | (3) |
| $Y7_i = Y8_i - k7 b7_{i-1}$ | (4) |
| $Y6_i = Y7_i - k6 b6_{i-1}$ | (5) |

TABLE 1-continued $$Y5_i = Y6_i - k5b5_{i-1} \quad (6)$$
$$Y4_i = Y5_i - k4b4_{i-1} \quad (7)$$
$$Y3_i = Y4_i - k3b3_{i-1} \quad (8)$$
$$Y2_i = Y3_i - k2b2_{i-1} \quad (9)$$
$$Y1_i = Y2_i - k1b1_{i-1} \quad (10)$$
$$b10_i = b9_{i-1} + k9Y9_i \quad (11)$$
$$b9_i = b8_{i-1} + k8Y8_i \quad (12)$$
$$b8_i = b7_{i-1} + k7Y7_i \quad (13)$$
$$b7_i = b6_{i-1} + k6Y6_i \quad (14)$$
$$b6_i = b5_{i-1} + k5Y5_i \quad (15)$$
$$b5_i = b4_{i-1} + k4Y4_i \quad (16)$$
$$b4_i = b3_{i-1} + k3Y3_i \quad (17)$$
$$b3_i = b2_{i-1} + k2Y2_i \quad (18)$$
$$b2_i = b1_{i-1} + k1Y1_i \quad (19)$$
$$b1_i = Y1_i \quad (20)$$

The input energy level is represented by "E" and this is generated either internally from prestored parameters or from an external source. A term "I" represents the input excitation value which is representative of either random noise that is utilized in the generation of hissing sounds that are made by the spoken voice or periodic signals corresponding to voiced sounds. A number of constants are provided that are prestored and labeled k1 through k10. The constants k1–k10 describe the characteristics of the Equations that correspond to the shape of the mouth and the position of the tongue and teeth in order to allow generation of the various sounds corresponding to speech. An additional set of parameters labeled b1 through b10 are provided that are generated in a previous sample time and which are utilized to sequentially calculate the values labeled Y1 through Y10.

Initially, the value for $Y10_i$ is calculated according to Equation 1 utilizing the product of the input energy level and the excitation energy, the value of k10 and the previously calculated value of b10. The previously calculated value for b10 is represented by the subscript "i−1". Values for $Y9_i$ through $Y1_i$ are then calculated according to Equations 2–10 with $Y1_i$ being equal to the final result for the i'th sample time. The B-values are then calculated according to Equations 11–20 by utilizing both the calculated Y1 through Y10 values for that sample time and the previously calculated b1 through b9 values. These new b values are stored for use in calculation of the Y-values during the next sample time.

Figures 1, 2:
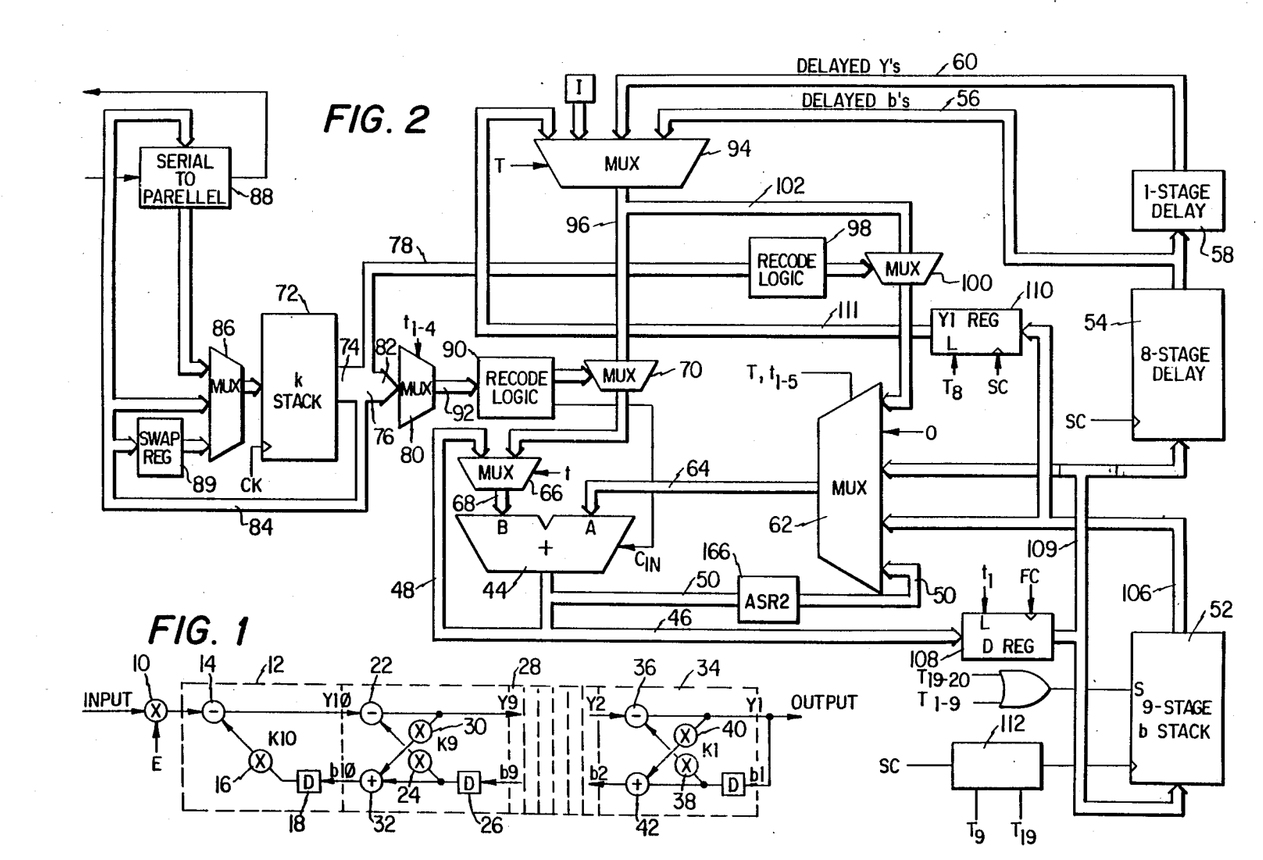
FIG. 1 illustrates a functional block diagram of a ten stage digital filter for processing of the arithmetic Equations.
FIG. 2 illustrates a schematic diagram of the system for multiplexing a single adder in accordance with the present invention.

Referring now to FIG. 1, there is illustrated a functional diagram of a 10 stage lattice filter for processing the twenty Equations in Table 1. The input energy is input to a multiplication block 10 which also receives the excitation energy E to generate a product therefor. This product EI is input to a first stage 12 of the digital filter to a subtraction block 14. The subtraction block 14 subtracts the product of the input energy and the excitation energy from the product generated by a multiplication block 16. The multiplication block 16 receives a delayed value of b10 which is delayed through a delay block 18 and multiplies it by the constant k10. The output of the subtraction block 14 is labeled Y10. Y10 is input to a second stage 20 of the digital filter to a subtraction block 22. The subtraction block 22 receives a product from a multiplication block 24 which is the product of K9 and the delayed value of b9 which is delayed through a delay block 26. The output of the subtraction block 22 is the value Y9 which is input to a third stage 28 of the digital filter.

The generated Y9 value is input to a multiplication block 30 for multiplication by the constant k9 and then summed with the delayed value of b9 in a summation block 32. This summation block outputs the value of b10 which is then input to the delay block 18. The delay block 18 represents the delay for one sample time.

The third stage 28 performs a similar calculation as the second stage 20 except that it utilizes the constant k8. Subsequent stages calculate the values Y8 through Y2 with a final tenth stage 34 calculating the Y1-value for output from the digital filter. The tenth stage 34 receives the Y2-value at the input of a subtraction block 36 to subtract it from the product output by a multiplication block 38. The product generated by the multiplication block 38 is the product of the delayed value b1 and the constant k1. In addition, Y1 is input to a multiplication block 40 for multiplication by the constant k1, the product thereof input to an addition block 42 for addition with the delayed value of b1. The output is the value b2.

In order to process the input excitation value I through the ten stage lattice filter, it is necessary to process the Equations 1–20 individually. Each of these Equations requires one multiplication and one addition or subtraction step. If, for example, the sampling rate is 10 KHz, the processing rates for each of the Equations is 200 KHz. Therefore, the multiplication and addition operations must be performed at a rate greater than 200 KHz. In accordance with the present invention, a single full adder is utilized with the addition or subtraction operation requiring one clock cycle and the multiplication step requiring four clock cycles. The single full adder is multiplexed to perform all of the operations. A slow clock having a rate of 200 KHz is provided to determine the duration of time in which each equation must be processed and a fast clock is provided having the rate of five times the slow clock or 1 MHz. This requires the full adder to operate at a 1 MHz rate.

Referring now to FIG. 2, there is illustrated a schmetic block diagram of the system in accordance with the present invention for processing the Equations 1–20 of Table 1. The system includes a full adder 44 which has an A-input, a B-input and a Carry-input labeled $C_{in}$. Full adders are more fully described in *The TTL Data Book For Design Engineers*, 2nd Edition, Texas Instruments, Inc., October 1976, pp. 7–54 and U.S. Pat. No. 4,449,197, issued to J. L. Henry on May 15, 1984. In the multiplication mode, the A and B-inputs of the adder 44 are multiplexed to sum partial products generated in accordance with a modified Booth's algorithm and, in the addition mode, the A and B-inputs are multiplexed to add the product of the multiplication step to an external stored parameter which, as illustrated in Table 1, is the result of a previous Equation.

The adder 44 is fifteen bits wide with the output thereof connected to an output data bus 46 which is fourteen bits wide and a feed back data bus 48 which is fifteen bits wide. The data bus 48 is multiplexed at the B-input of the adder 44 and has the bits thereof shifted for the multiplication operation, as will be described hereinbelow. The output data bus 46 is connected to the input of a latch 108. The output of the latch 108 is connected to a data bus 109. The data bus 109 is connected to a nine stage B stack 52 which is a first-in first-out stack. The data bus 109 is also connected to an eight stage delay stack 54 which is also a first-in first-out stack, the output of which is input to both a 14 bit wide delayed b data bus 56 and a one stage delay register 58. The output of the delay register 58 is input to a 14 bit wide delayed Y data bus 60.

The A-input of the adder 44 is connected to the output of a multiplexer 62 through a 15 bit wide bus 64. The B-input of the adder 44 is connected to the output of a multiplexer 66 through a 15 bit wide data bus 68. The multiplexer 66 has two inputs, one input of which is connected to the feedback data bus 48 and the other of which is connected to the output of a multiplexer 70. The multiplexer 66 allows for selection of either the output of the multiplexer 70 or the output of the adder 44.

A ten bit wide, ten word deep first-in first-out K-stack 72 has the output thereof connected to a ten bit data bus 74. The data bus 74 has the first two bits thereof branched off in a data bus 78 and the remaining eight bits thereof input to a multiplexer 80 through an eight bit data bus 82. The data bus 74 is also branched off-through a feedback data bus 84 to the input of a multiplexer 86 and to the parallel input of a serial to parallel converter 88. The parallel output of the serial to parallel converter 88 is connected to the other input of the multiplexer 86, the input to the other input of the multiplexer 86, the output of which is connected to the input of the K-stack 72. The serial to parallel converter 88 has a serial input and a serial output for interfacing with an external source (not shown). In addition, a swap register 89 has the input thereof connected to the bus 84 and the output thereof connected to the input of the multiplexer 86. The register 89 allows the value of K10 and E to be "swapped" in the stored sequence, as well be described hereinbelow.

The K-stack 72 contains the multipliers for the multiplication operation performed by the system of the present invention. These are the k1 through k10 constants and the value of E. The multiplexer 86 allows input of data to the K-stack 72 from an external source through the serial to parallel converter 88 or recirculation of the data through the return data bus 84. In this manner, the same constants k1-k10 can be utilized for each generated sample.

In processing each of the Equations 1-20 in Table 1 with the system of FIG. 2, it is necessary to perform a multiplication followed by an addition or subtraction. Subtraction is facilitated by changing the sign of the multiplier prior to the multiplication step. Since only one full adder 44 is utilized, the operation thereof must be multiplexed during a given sample time. In the preferred embodiment, the multiplication scheme utilized is a modified Booth's algorithm. In this algorithm, it is necessary to analyze the multiplier output from the K-stack 72 by segmenting the multiplier into groups of three bits with one bit overlapping in each group with an implied bit to the right of the least significant bit. Therefore, a ten-bit multiplier will result in five 3-bit groups. Each group corresponds to a partial product with a ten-bit multiplier requiring the generation of five partial products $PP_1$, $PP_2$, $PP_3$, $PP_4$ and $PP_5$. In order to generate these partial products, it is first necessary to determine the "modified Booth operator" to determine the operation that must be performed on a given multiplicand in order to generate the respective partial products. The modified Booth operators are "0", "+1", "−1", "+2" and "−2". The presence of a "−" requires the generation of the two's complement of the mulplicand and the presence of a "2" requires shifting of the multiplicand to the left by one bit with a "1" requiring no shift. Therefore, the partial products consist of the multiplicand or its two's complement shifted to the left by a maximum of one place. A modified Booth operator of "0" results in a partial product having all logic bits therein at a logic "0". The modified Booth operators are generated as shown in Table 2.

TABLE 2

| THREE-BIT GROUP | | | |
|---|---|---|---|
| A | B | C | OPERATOR |
| 0 | 0 | 0 | 0 |
| 0 | 0 | 1 | +1 |
| 0 | 1 | 0 | +1 |
| 0 | 1 | 1 | +2 |
| 1 | 0 | 0 | −2 |
| 1 | 0 | 1 | −1 |
| 1 | 1 | 0 | −1 |
| 1 | 1 | 1 | 0 |

After generation of the partial products, they are sequentially shifted by two places and added to the preceding partial products. This will require the adder to first sum $PP_1$ with $PP_2$ and then sequentially sum $PP_3$–$PP_4$ with the intermediate products, resulting in four summation operations. After the product has been generated, an additional summation is required to complete each of the Equations 1-20 in Table 1 by selecting a delayed B-value from B-stack 100 or a previously calculated Y-value for the addend.

To determine the operation that is to be performed on the multiplicand, a recode logic circuit 90 is provided that is connected to the output of the multiplexer 80 through a two bit data bus 92. The output of the recode logic circuit 90 drives the multiplex input of the multiplexer 70 which has the input thereof connected to the output of a multiplexer 94 through a 14 bit wide data bus 96. The multiplexer 80 and the recode logic circuit 90 allow control of the multiplexer 70 for input of a generated partial product to the B-input of the adder 44.

The first step in the addition of partial products is to add the first two generated partial products $PP_1$ and $PP_2$. In the first step, $PP_2$ is generated by the recode logic circuit 90 and multiplexer 70 and $PP_1$ is generated separately for input to the A-input of the adder 44. A recode logic circuit 98 is connected to the two bit data bus 78 for receiving the first two bits of the ten bit data word output from the K-stack 72 and converting it to the appropriate Booth recode operator for generating the first partial product $PP_1$. The output of the recode logic circuit 98 is connected to the control input of a multiplexer 100. The multiplexer 100 has the input thereof connected to the output of the multiplexer 94 through a fourteen bit wide data bus 102 and the output thereof connected to one input of the multiplexer 62 through a fifteen bit wide data bus 104. The multiplexers 70 and 100 in conjunction with the recode logic circuits 90 and 98 allow for generation of the first two partial products of the multiplicand that is output by the multiplexer 94. These two partial products are appropriately shifted, as will be described hereinbelow, and input to the A and B-inputs of the adder 44 to provide the sum thereof. The remaining partial products are then generated by the recode logic circuit 90 and multiplexer 70 for input to the B-input of the adder 44 with the A input thereof connected to the summed output of the adder 44 through the feedback data bus 50 and the multiplexer 62.

The multiplexer 94 has four inputs thereto which are connected to the delayed Y data bus 60, the delayed B data bus 56 and to an external source (not shown) for receiving the value I of the input excitation signal. As described above with reference to Equations 1-20 in Table 1, the constants k1–k10 either multiply the Y-values or the B-values.

The multiplexer 62 has five inputs thereto and is operable to connect a number of different values to the A-input of the adder 44. One input of the multiplexer 62 is connected to the output of the multiplexer 100 to provide the first partial product $PP_1$ for the multiplication operation. The multiplexer 62 has the second input thereof connected to the feedback data bus 50 to provide the summed output of the adder 44 to the A-input thereof for addition of the third, fourth and fifth partial products in the multiplication operation. The multiplexer 62 has the third input thereof connected to the output of the B-stack 52 through a fourteen bit data bus 106 and the fourth input thereof connected to the data bus 109. The fifth input of the multiplexer is connected to a "0" value digital word.

In order to process data through the system of the present invention, two clock times are required. The first clock is a slow clock which operates at a frequency of 200 KHz and the second clock is a fast clock which operates at a frequency of 1 MHz. The slow clock is labeled SC and is utilized to generate twenty equal timing periods $T_1$–$T_{20}$ with the fast clock utilized as a time base to form the timing periods $t_1$–$t_5$ that divide each timing period or "T-times" $T_1$–$T_{20}$ into five equal segments. The periods $t_1$–$t_5$ are utilized to perform the multiplication and addition or subtraction step for each T-time.

The K-stack 72 and the eight stage delay stack 54 are incremented by the slow clock with the B-stack 52 also incremented by the slow clock. However, clocking of the B-stack 52 is inhibited during the T-times $T_9$ and $T_{19}$. This is facilitated by a logic block 112 which is disposed between the slow clock signal and the clock input of the B stack 52 and is controlled by the signals corresponding to the T-times $T_9$ and $T_{19}$. The multiplexers are controlled by the fast clock timing signals $t_1$–$t_5$, depending upon the operation that is to be performed, as will be described hereinbelow.

In addition to supplying data to the multiplexer 62, the output of the B-stack 52 is also connected to the input of a Y1-register 110. The Y1-register 110 is controlled by the slow clock signal and the $T_8$ timing signal to selectively load the b1 value output by the B-stack 52. The output of the Y1-register 110 is connected to one input of the multiplexer 94 through the data bus 111.

Figures 3, 5:
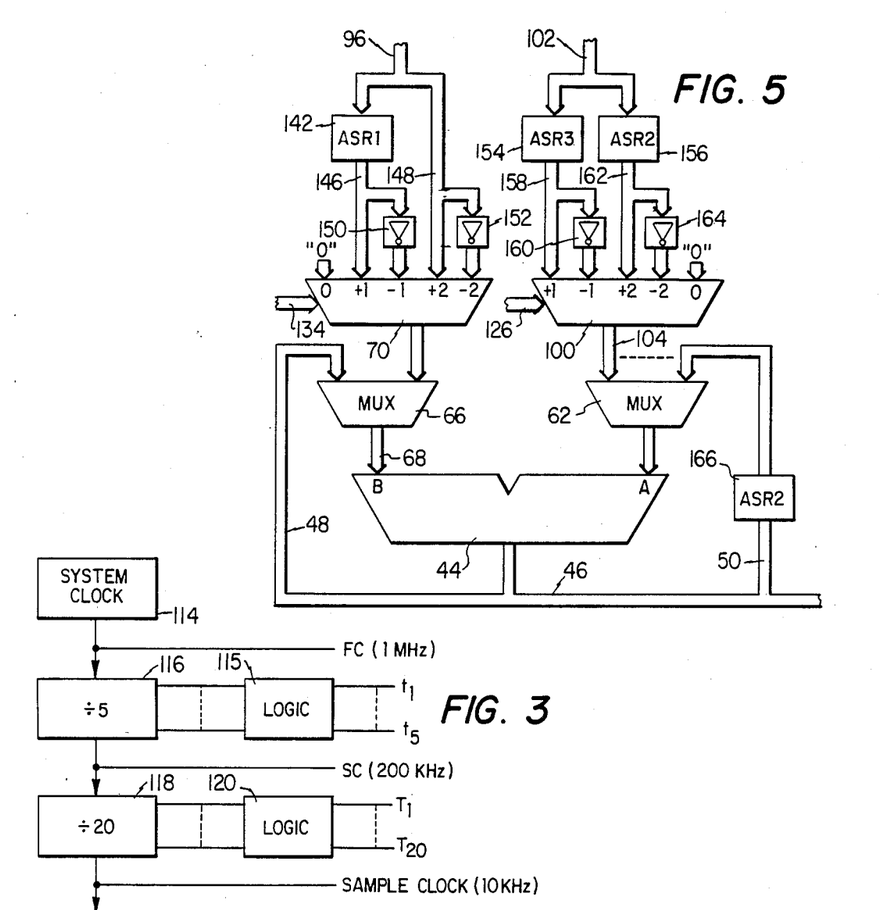
FIG. 3 illustrates a block diagram of the timing circuit for generating the fast and slow timing clocks.
FIG. 5 illustrates a block diagram of the multiplex circuit for reconfiguring the adder as a multiplier.

Referring now to FIG. 3, there is illustrated a block diagram of the timing circuit for generating the fast and slow clock signals. A system clock 114 is provided that generates the fast clock signal at the rate of 1 MHz. This signal is input to a divide-by-five circuit 116 to output the slow clock signal of 200 KHz. A logic circuit 115 receives inputs from both the fast and slow clock signals and divides each cycle of the slow clock into five timing segments $t_1$–$t_5$. The 200 KHz signal is input to a divide-by-twenty circuit 118 to output the sample clock having a frequency of 10 KHz. The sample clock operates at the rate at which each series of Equations is processed through the lattice filter, with the Y1-register 110 being updated once during each sample clock. The intermediate outputs of the divide-by-twenty circuit 118 are input to a logic circuit 120 to generate the $T_1$–$T_{20}$ timing signals. Each of these timing signals is a pulse having a duration of five microseconds with the $T_1$ timing period setting the system to an initial state and then allowing the slow clock to sequence through the Equations of Table 1.

Figure 4:
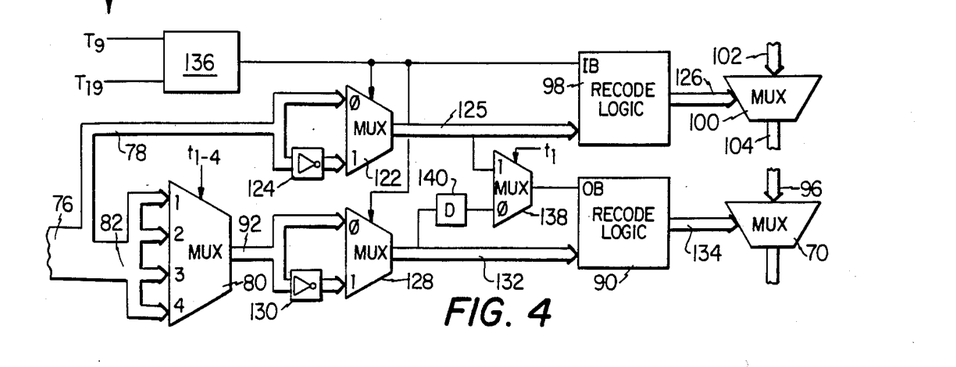
FIG. 4 illustrates a block diagram of the recode logic circuit for generating the recode bits.

Referring now to FIG. 4, there is illustrated a detailed schematic diagram of the recode logic circuits 90 and 98 for generating the Booth operators for the modified Booth's algorithm, wherein like numerals refer to like parts in the various figures. As described above, the preferred embodiment utilizes a multiplier with 10 bits. In accordance with Booth's modified algorithm, this will generate five partial products. The first partial product is generated with the first two bits that are output by the K-stack 72 through the data bus 78 in addition to one implied bit. These two bits are multiplexed with a multiplexer 122 that has two inputs labeled "0" and "1". The "0" input passes the data directly through the multiplexer 122 the "1" input represents the inverted digital words. This inversion is facilitated by a two bit wide inverter 124 which is disposed in series with the "1" input.

The output of the multiplexer 122 is a two bit wide output which is input to the recode logic circuit 98. The recode circuit 98 generates an output signal that corresponds to the Booth recoding operators 0, +1, −1, +2 and −2, which parameters are input to the control input of the multiplexer 100 through a data bus 126. The control input can be in the form of a binary word or in the form of five separate signal lines that are individually activated.

The remaining eight bits of the ten bit multiplier word output by the K stack 72 are divided into four two-bit words that are input to the multiplexer 80 on the inputs labeled "1", "2", "3" and "4". The output of the multiplexer 80 is input to the two bit wide data bus 92 for input to a multiplexer 128 having two inputs labeled "0" and "1". The multiplexer 128 is similar to the multiplexer 122 in that the "0" input thereof passes the data directly therethrough and the "1" input thereof passes inverted data therethrough. A two bit wide inverter 130 is placed in series with the "1" input of the multiplexer 128 to facilitate this inversion. The output of the multiplexer 128 is connected to a two bit wide data bus 132 for input to the recode logic circuit 90. The recode logic circuit 90 operates similar to the recode logic circuit 98 in that it also outputs the Booth operators for control of the multiplexer 70 through a data bus 134.

In order to generate the first partial product $PP_1$, it is necessary to input an implied bit into the recode logic circuit 98 to determine the correct Booth's operator. For a multiplier that is positive, this implied bit is "0". However, subtraction in the present system is facilitated by generating a negative product. For the operations defined by Equations 1–10 in Table 1, a subtraction operation is required. During the T-times that these operations are being processed, a signal is supplied to the multiplexers 122 and 128 selecting the inverted output value. This control signal is generated by a circuit 136 that receives both the $T_9$ and $T_{19}$ signals as inputs thereto. Upon receiving the $T_9$ signal, the multiplexers 122 and 128 select the inverted two bit value and upon receiving the $T_{19}$ signal, the multiplexers 122 and 128 select the noninverted two bit output. The circuit 136 is essentially a set/reset circuit with the signal $T_9$ setting the circuit and the $T_{19}$ signal resetting the circuit. The output of the circuit 136 is also input to the recode logic circuit 98 at the input labeled "IB" for the implied bit such that an implied bit of "1" can be generated for a negative multiplier.

During that time $t_1$ that $PP_1$ is being generated, $PP_2$ must also be generated, thereby requiring the generation of the correct Booth's operator. To generate this operator, the multiplexer 80 selects the third and forth bit of the multiplexer word. In addition, the most significant bit of the previous two bit word must be retained since the modified Booths algorithm requires analysis of three of the multiplier word bits. This is the overlapping bit between two adjacent three bit sections. A multiplexer 138 has the output thereof connected to the overflow bit input of the recode logic circuit 90 labeled "OB". The multiplexer 138 has one input thereof connected to the most significant bit on the two bit data bus 125 and the other input thereof connected to a one stage delay register 140. The input of the delay register 140 is connected to the most significant bit on the two bit data register 132. The control signal for the multiplexer 138 is labeled $t_1$ and corresponds to the first pass in the multiplication operation.

In operation, the multiplexer 80 is controlled by the $t_1$–$t_4$ signals to sequentially generate $PP_2$, $PP_3$, $PP_4$ and $PP_5$. The first partial product $PP_1$ is always generated by the multiplexer 122 and recode logic circuit 98 during time $t_1$. For the first pass during time $t_1$, the Booth recoding operator for $PP_1$ is generated on the output of the recode logic circuit 98. During the same time period $t_1$, the most significant bit on the output of the multiplexer 122 is input to the multiplexer 138 and passed therethrough to the overflow bit input of the recode logic circuit 90. Simultaneously, the multiplexer 80 is controlled to select the third and fourth bits of the ten bit multiplier word and input them to the recode logic circuit 90 to generate the Booth operator corresponding to $PP_2$. In addition, the most significant bit output by the multiplexer 128 is clocked into the delay register 140 for use in the next sequential operation.

The next step of the multiplication takes place during the time period $t_2$ in which $PP_3$ is generated by selecting the bits five and six on input "2" of the multiplexer 80 and inputting them to the recode logic circuit 90. The multiplexer 138 is controlled to input the contents of the delay register 140 to the OB-input of the recode logic circuit 90. In a similar manner, $PP_4$ and $PP_5$ are generated by selecting input "3" and "4" of the multiplexer 80 for processing through the recode logic circuit 90. As described above, $PP_1$ and $PP_2$ are added together and then sequentially added with $PP_3$, $PP_4$ and $PP_5$ to provide a product within four clock cycles of the fast clock.

Referring now to FIG. 5, there is illustrated a detailed block diagram of the multiplexers for generating the partial products for input to the adder 44. The data bus 96 that is input to the multiplexer 70 is branched into two branches with one branch input to a bit shifter 142 and another branch directly input to the "+2" input of the multiplexer 70 and also the "−2" input thereof through an invertor circuit 152. The bit shifter 142 is labeled "ASR1" and arithmetically shifts the digital word on the data bus 96 by one bit to the right and extends the sign bits and outputs this to a data bus 146. The data bus 146 is input to the "+1" input of the multiplexer 70 and also input to the "−1" input through an inverter circuit 150. The data bus 102 that provides data for the multiplexer 100 is input to a bit shifter 154 labeled "ASR3" and also into a bit shifter 156. The bit shifter 154 arithemtically shifts the data word on the data bus 102 by three bits to the right and the bit shifter 156 arithmetically shifts the data word input thereto by two bits to the right. The output of the bit shifter 154 is input to a data bus 158 which is connected directly to the "+1" input of the multiplexer 100 and also to the "−1" input thereof through an inverter circuit 160. The output of the bit shifter 156 is input to a data bus 162 which is connected directly to the "+2" input of the multiplexer 100 and also the "−2" input thereof through an inverter 164. In addition to shifting the bits of the data input to the multiplexers 70 and 100, the summation data output by the adder 44 is also shifted by a bit shifter 166 labeled "ASR2" by two bits to the right. It should be noted that all of the bit shifting is relative.

In order to explain the operation of the circuit of FIG. 5, an example of digital multiplication using modified Booths algorithm is illustrated in Table 3.

TABLE 3

|  |  |  |  |
|---|---|---|---|
|  | 0.11010110011100 | = 13724 | *2**(−14) |
|  | 1.101011001 | = ×(−167) | *2**(−9) |
| $PP_1$ | 000000000011010110011100 | +1 |  |
| $PP_2$ | 1111111001010011001000 | −2 |  |
| $PP_3$ | 00000110101100111000 | +2 |  |
| $PP_4$ | 000011010110011100 | +1 |  |
| $PP_5$ | 1100101001100100 | −1 |  |
|  | 11.1011101000011100111100 | = −2291908 | *2**(−23) |
| PP1 | 000011010110011100 | +1 |  |
| PP2 | 1001010011001000 | −2 |  |
| $\Sigma_1$ | 101000100010111 |  |  |
| $\Sigma_1$ | 11101000100010111 |  |  |
| PP3 | 0110101100111000 | +2 |  |
| $\Sigma_2$ | 010100111100001 |  |  |
| $\Sigma_2$ | 00010100111100001 |  |  |
| PP4 | 0011010110011100 | +1 |  |
| $\Sigma_3$ | 010010101000110 |  |  |
| $\Sigma_3$ | 00010010101000110 |  |  |
| PP5 | 1100101001100100 | −1 |  |
| final product | 1.10111010000011 |  |  |

In Table 3, the multiplier is a fifteen bit fractional data word with a value of "13724*2**(−14)" and the multiplier is a 10 bit data word with a value of "−167*2**(−9)". Since these two numbers are two's complement, the most significant bit represents the sign of the number. The ten bit multiplier requires the generation of five partial products which are generated by altering the multiplicand in accordance with the modified Booth's operators that are generated. The Booth's operator generated for $PP_1$ is "+1", "−2" for $PP_2$, "+2", for $PP_3$ "+2", for $PP_4$ "+1" and for $PP_5$ "−1". A "+1" indicates the operation whereby the multiplicand is not altered, a "−1" requires the two's complement to be generated, a "+2" requires the multiplicand to be shifted by one place to the left and a "−2" requires shifting one place to the left and generation of the two's complement of the multiplicand. Since the shifting is an arithmetic shift, the sign bit is duplicated. Summation of the partial products requires shifting to the left by two places for each sequential partial product. For example, $PP_2$ is shifted to the left two places with respect to $PP_1$ and $PP_3$ is shifted two places to the left with respect to $PP_2$, etc. The shifting of two places to the left is facilitated by the bit shifter 166 which essentially hardwires the data bus 50 to provide a two bit shift with respect to the remaining data on the A input of the adder 44.

Multiplication of a fifteen bit number and a ten bit number results in a 25-bit product. To extend the sign of $PP_1$ ten zeros are added to the left. In a similar manner, $PP_2$ is extended eight additional sign bits, $PP_3$ is extended six additional sign bits, $PP_4$ is extended four additional sign bits and $PP_5$ is extended two additional sign bits. When the addition is complete, nine of the least significant bits and the most significant bit are truncated from the answer such that only a fifteen bit product results, thereby reducing the need for a 25 bit output data bus. All of the bit shifting and two's complement generation is facilitated by the shifting circuits and inverter circuits such that the proper partial products can be generated and added to the shifted sum. The first shift between $PP_1$ and $PP_2$ is facilitated by the difference in bit shifting between the bit shifters 142 and 144 and the bit shifters 154 and 156. The remainder two bit shifter relative is facilitated by the bit shifter 166 on the sum output.

In operation, Equations 1-20 in Table 1 are sequentially calculated with multiplier constants extracted from the K stack 72 and output data from the adder 44 shuttled back and forth between the multiplexer circuits, the B-stack 52 and the eight stage delay 54. As described above, each Equation requires one multiplication step and one addition or subtraction step which is processed in five cycles of the fast clock during each T-time. There are 20 T-times, one for each equation.

During processing of the data, the calculated Y-values and the calculated B-values are all sequentially loaded into the eight stage delay for each cycle of the slow clock to delay a particular value eight cycles of the slow clock. The B-values are extracted from the top of the eight stage delay 54 and input as multiplicands to the multiplexer 94. The one stage delay 58 adds an additional one cycle delay for the data in the delay stack 54 which, as will be described hereinbelow, is for inputting of the delayed Y-values as multiplicands to the multiplexer 94. As can be seen from Equations 1-20 in Table 1, the multiplicand for calculating the Y-values is a previously calculated value which is generated by delaying the value through the delay stages 52 and 54. To calculate a given Y-value, it is necessary to have the preceeding Y-value as an addend in addition to the product of the multiplier and multiplicand. After generation of a given Y-value, it is stored in the D-register 108 to allow for generation of the product in the next T-time. After generation of the next product, the stored Y-value is then removed from the D-register 108 and input to the A-input of the adder 44 and summed with the product multiplexed on the B-input. Since Y-values require a subtraction operation, the sign of the multiplier is changed.

After generation of the Y-values, the B-values are then calculated beginning with the value of b10 in accordance with Equation 11. The delayed value of $Y_9$ is extracted from the one stage delay 58 for the multiplicand, in addition to retrieval of the constant k9 from the K-stack 72 as the multiplicand. After the product has been formed, the value of b9 is extracted from the top of the B-stack 52 as the addend, which value is generated in the previous T-time. The remaining B-values are then calculated and stored, as will be described in more detail hereinbelow.

The system of the present invention first calculates the delayed B-values beginning with $b9_{i-1}$ to $b2_{i-1}$ and stores these values in both the B-stack 52 and the delay stack 54. After calculation of the delayed B-values using previously calculated Y-values, the previously calculated value of $b9_{i-1}$ calculated during $T_1$ has circulated through the delay stack 54 to allow calculation of the $Y9_i$ value. During calculation of the Y-values, the clock signal for the B-stack 52 is turned off such that an additional delay is provided for the next sequential calculation of B-values, as will be described hereinbelow.

To more clearly illustrate the data flow through the system of FIG. 1, the status of all of the registers is illustrated in Table 4 as a function of the T-times $T_1-T_{20}$.

TABLE 4

| Time | | | | Adder | | | D | Delay Stack | | b | Y1 |
|---|---|---|---|---|---|---|---|---|---|---|---|
| T | t | Mp | Mc | A | B | Σ | Register | Tap 1 | Tap 2 | Stack | Reg |
| 1 | 1 | K8 | $Y8_{i-1}$ | $PP_1$ | $PP_2$ | $b10_{i-1}$ | $b10_{i-1}$ | $Y7_{i-2}$ | $Y8_{i-1}$ | $b8_{i-2}$ | |
|   | 2 | " | " | $\Sigma_1$ | $PP_3$ | $\Sigma_1$ | " | " | " | " | |
|   | 3 | " | " | $\Sigma_2$ | $PP_4$ | $\Sigma_2$ | " | " | " | " | |
|   | 4 | " | " | $\Sigma_3$ | $PP_5$ | $\Sigma_3$ | " | " | " | " | |
|   | 5 | " | " | $b8_{i-2}$ | $k8Y8_{i-1}$ | $k8Y8_{i-1}$ | " | " | " | " | " |
| 2 | 1 | k7 | $Y7_{i-1}$ | $PP_1$ | $PP_2$ | $b9_{i-1}$ | $b9_{i-1}$ | $Y6_{i-2}$ | $Y7_{i-1}$ | $b7_{i-2}$ | |
|   | 2 | " | " | $\Sigma_1$ | $PP_3$ | $\Sigma_1$ | " | " | " | " | |
|   | 3 | " | " | $\Sigma_2$ | $PP_4$ | $\Sigma_2$ | " | " | " | " | |
|   | 4 | " | " | $\Sigma_3$ | $PP_5$ | $\Sigma_3$ | " | " | " | " | |
|   | 5 | " | " | $b7_{i-i-1}$ | $k7Y7_{i-1}$ | " | " | " | " | " | |
| 3 | 1 | k6 | $Y6_{i-1}$ | $PP_1$ | $PP_2$ | $b8_{i-1}$ | $b8_{i-1}$ | $Y5_{i-2}$ | $Y6_{i-1}$ | $b6_{i-2}$ | |
|   | 2 | " | " | $\Sigma_1$ | $PP_3$ | $\Sigma_1$ | " | " | " | " | |
|   | 3 | " | " | $\Sigma_2$ | $PP_4$ | $\Sigma_2$ | " | " | " | " | |
|   | 4 | " | " | $\Sigma_3$ | $PP_5$ | $\Sigma_3$ | " | " | " | " | |
|   | 5 | " | " | $b6_{i-2}$ | $k6Y6_{i-1}$ | $k6Y6_{i-1}$ | " | " | " | " | " |
| 4 | 1 | k5 | $Y5_{i-1}$ | $PP_1$ | $PP_2$ | $b7_{i-1}$ | $b7_{i-1}$ | $Y4_{i-2}$ | $Y5_{i-1}$ | $b5_{i-2}$ | |
|   | 2 | " | " | $\Sigma_1$ | $PP_3$ | $\Sigma_1$ | " | " | " | " | |
|   | 3 | " | " | $\Sigma_2$ | $PP_4$ | $\Sigma_2$ | " | " | " | " | |
|   | 4 | " | " | $\Sigma_3$ | $PP_5$ | $\Sigma_3$ | " | " | " | " | |
|   | 5 | " | " | $b5_{i-2}$ | $k5Y5_{i-1}$ | $k5Y5_{i-1}$ | " | " | " | " | " |
| 5 | 1 | k4 | $Y4_{i-1}$ | $PP_1$ | $PP_2$ | $b6_{i-1}$ | $b6_{i-1}$ | $Y3_{i-2}$ | $Y4_{i-1}$ | $b4_{i-2}$ | |
|   | 2 | " | " | $\Sigma_1$ | $PP_3$ | $\Sigma_1$ | " | " | " | " | |
|   | 3 | " | " | $\Sigma_2$ | $PP_4$ | $\Sigma_2$ | " | " | " | " | |
|   | 4 | " | " | $\Sigma_3$ | $PP_5$ | $\Sigma_3$ | " | " | " | " | |
|   | 5 | " | " | $b4_{i-2}$ | $k4Y4_{i-1}$ | $k4Y4_{i-1}$ | " | " | " | " | " |
| 6 | 1 | k3 | $Y3_{i-1}$ | $PP_1$ | $PP_2$ | $b5_{i-1}$ | $b5_{i-1}$ | $Y2_{i-2}$ | $Y3_{i-1}$ | $b3_{i-2}$ | |
|   | 2 | " | " | $\Sigma_1$ | $PP_3$ | $\Sigma_1$ | " | " | " | " | |
|   | 3 | " | " | $\Sigma_2$ | $PP_4$ | $\Sigma_2$ | " | " | " | " | |
|   | 4 | " | " | $\Sigma_3$ | $PP_5$ | $\Sigma_3$ | " | " | " | " | |
|   | 5 | " | " | $b3_{i-2}$ | $k3Y3_{i-1}$ | $k3Y3_{i-1}$ | " | " | " | " | |
| 7 | 1 | k2 | $Y2_{i-1}$ | $PP_1$ | $PP_2$ | $b4_{i-1}$ | $b4_{i-1}$ | $Y1_{i-2}$ | $Y2_{i-1}$ | $b2_{i-2}$ | |
|   | 2 | " | " | $\Sigma_1$ | $PP_3$ | $\Sigma_1$ | " | " | " | " | |
|   | 3 | " | " | $\Sigma_2$ | $PP_4$ | $\Sigma_2$ | | | | | |

TABLE 4-continued

| Time | | Adder | | | D | Delay Stack | | b | Y1 |
|---|---|---|---|---|---|---|---|---|---|
| T | t | Mp | Mc | A | B | Σ | Register | Tap 1 | Tap 2 | Stack | Reg |

| T | t | Mp | Mc | A | B | Σ | D Register | Tap 1 | Tap 2 | b Stack | Y1 Reg |
|---|---|---|---|---|---|---|---|---|---|---|---|
| | 4 | " | " | $\Sigma_3$ | $PP_5$ | $\Sigma_3$ | " | " | " | " | |
| | 5 | " | " | $b2_{i-2}$ | $k2Y2_{i-1}$ | $k2Y2_{i-1}$ | " | " | " | " | |
| 8 | 1 | k1 | $Y1_{i-1}$ | $PP_1$ | $PP_2$ | $b3_{i-1}$ | $b3_{i-1}$ | $Y1_{i-1}$ | $Y2_{i-1}$ | $Y1_{i-1}$ | |
| | 2 | " | " | $\Sigma_1$ | $PP_3$ | $\Sigma_1$ | " | " | " | " | " |
| | 3 | " | " | $\Sigma_2$ | $PP_4$ | $\Sigma_2$ | " | " | " | " | " |
| | 4 | " | " | $\Sigma_3$ | $PP_5$ | $\Sigma_3$ | " | " | " | " | " |
| | 5 | " | " | $b1_{i-2}$ | $k1Y1_{i-1}$ | $k1Y1_{i-1}$ | " | " | " | " | " |
| 9 | 1 | -k10 | $b10_{i-1}$ | $PP_1$ | $PP_2$ | $b2_{i-1}$ | $b2_{i-1}$ | $b10_{i-1}$ | $EI_i$ | $EI_i$ | $Y1_{i-1}$ |
| | 2 | " | " | $\Sigma_1$ | $PP_3$ | $\Sigma_1$ | " | " | " | " | " |
| | 3 | " | " | $\Sigma_2$ | $PP_4$ | $\Sigma_2$ | " | " | " | " | " |
| | 4 | " | " | $\Sigma_3$ | $PP_5$ | $\Sigma_3$ | " | " | " | " | " |
| | 5 | " | " | $EI_i$ | $-k10b10_{i-1}$ | $-k10b10_{i-1}$ | " | " | " | " | " |
| 10 | 1 | -k9 | $b9_{i-1}$ | $PP_1$ | $PP_2$ | $Y10_i$ | $Y10_i$ | $b9_{i-1}$ | $b10_{i-1}$ | $b10_{i-1}$ | " |
| | 2 | " | " | $\Sigma_1$ | $PP_3$ | $\Sigma_1$ | " | " | " | " | " |
| | 3 | " | " | $\Sigma_2$ | $PP_4$ | $\Sigma_2$ | " | " | " | " | " |
| | 4 | " | " | $\Sigma_3$ | $PP_5$ | $\Sigma_3$ | " | " | " | " | " |
| | 5 | " | " | $Y10_{i-2}$ | $-k9b9_{i-1}$ | $-k9b9_{i-1}$ | " | " | " | " | " |
| 11 | 1 | -k8 | $b8_{i-1}$ | $PP_1$ | $PP_2$ | $Y9_i$ | $Y9_i$ | $b8_{i-1}$ | $b9_{i-1}$ | " | " |
| | 2 | " | " | $\Sigma_1$ | $PP_3$ | $\Sigma_1$ | " | " | " | " | " |
| | 3 | " | " | $\Sigma_2$ | $PP_4$ | $\Sigma_2$ | " | " | " | " | " |
| | 4 | " | " | $\Sigma_3$ | $PP_5$ | $\Sigma_3$ | " | " | " | " | " |
| | 5 | " | " | $Y9_i$ | $-k8b8_{i-1}$ | $-k8Y8_{i-1}$ | " | " | " | " | " |
| 12 | 1 | -k7 | $b7_{i-1}$ | $PP_1$ | $PP_2$ | $Y8_i$ | $Y8_i$ | $b7_{i-1}$ | $b8_{i-1}$ | " | " |
| | 2 | " | " | $\Sigma_1$ | $PP_3$ | $\Sigma_1$ | " | " | " | " | " |
| | 3 | " | " | $\Sigma_2$ | $PP_4$ | $\Sigma_2$ | " | " | " | " | " |
| | 4 | " | " | $\Sigma_3$ | $PP_5$ | $\Sigma_3$ | " | " | " | " | " |
| | 5 | " | " | $Y8_i$ | $-k7b7_{i-1}$ | $-k7Y7_{i-1}$ | " | " | " | " | " |
| 13 | 1 | -k6 | $b6_{i-1}$ | $PP_1$ | $PP_2$ | $Y7_i$ | $Y7_i$ | $b6_{i-1}$ | $b7_{i-1}$ | " | " |
| | 2 | " | " | $\Sigma_1$ | $PP_3$ | $\Sigma_1$ | " | " | " | " | " |
| | 3 | " | " | $\Sigma_2$ | $PP_4$ | $\Sigma_2$ | " | " | " | " | " |
| | 4 | " | " | $\Sigma_3$ | $PP_5$ | $\Sigma_3$ | " | " | " | " | " |
| | 5 | " | " | $Y7_i$ | $-k6b6_{i-1}$ | $-k6Y6_{i-1}$ | " | " | " | " | " |
| 14 | 1 | -k5 | $b5_{i-1}$ | $PP_1$ | $PP_2$ | $Y6_i$ | $Y6_i$ | $b5_{i-1}$ | $b6_{i-1}$ | " | " |
| | 2 | " | " | $\Sigma_1$ | $PP_3$ | $\Sigma_1$ | " | " | " | " | " |
| | 3 | " | " | $\Sigma_2$ | $PP_4$ | $\Sigma_2$ | " | " | " | " | " |
| | 4 | " | " | $\Sigma_3$ | $PP_5$ | $\Sigma_3$ | " | " | " | " | " |
| | 5 | " | " | $Y6_i$ | $-k5b5_{i-1}$ | $-k5Y5_{i-1}$ | " | " | " | " | " |
| 15 | 1 | -k4 | $b4_{i-1}$ | $PP_1$ | $PP_2$ | $Y5_i$ | $Y5_i$ | $b4_{i-1}$ | $b5_{i-1}$ | " | " |
| | 2 | " | " | $\Sigma_1$ | $PP_3$ | $\Sigma_1$ | " | " | " | " | " |
| | 3 | " | " | $\Sigma_2$ | $PP_4$ | $\Sigma_2$ | " | " | " | " | " |
| | 4 | " | " | $\Sigma_3$ | $PP_5$ | $\Sigma_3$ | " | " | " | " | " |
| | 5 | " | " | $Y5_i$ | $-k4b4_{i-1}$ | $k4Y4_{i-1}$ | " | " | " | " | " |
| 16 | 1 | -k3 | $b3_{i-1}$ | $PP_1$ | $PP_2$ | $Y4_i$ | $Y4_i$ | $b3_{i-1}$ | $b4_{i-1}$ | " | " |
| | 2 | " | " | $\Sigma_1$ | $PP_3$ | $\Sigma_1$ | " | " | " | " | " |
| | 3 | " | " | $\Sigma_2$ | $PP_4$ | $\Sigma_2$ | " | " | " | " | " |
| | 4 | " | " | $\Sigma_3$ | $PP_5$ | $\Sigma_3$ | " | " | " | " | " |
| | 5 | " | " | $Y4_i$ | $-k3b3_{i-1}$ | $-k3Y3_{i-1}$ | " | " | " | " | " |
| 17 | 1 | -k2 | $b2_{i-1}$ | $PP_1$ | $PP_2$ | $Y3_i$ | $Y3_i$ | $b2_{i-1}$ | $b3_{i-1}$ | " | " |
| | 2 | " | " | $\Sigma_1$ | $PP_3$ | $\Sigma_1$ | " | " | " | " | " |
| | 3 | " | " | $\Sigma_2$ | $PP_4$ | $\Sigma_2$ | " | " | " | " | " |
| | 4 | " | " | $\Sigma_3$ | $PP_5$ | $\Sigma_3$ | " | " | " | " | " |
| | 5 | " | " | $Y3_i$ | $-k2b2_{i-1}$ | $-k2Y2_{i-1}$ | " | " | " | " | " |
| 18 | 1 | -k1 | $b1_{i-1}$ | $PP_1$ | $PP_2$ | $Y2_i$ | $Y2_i$ | $Y10_i$ | $b2_{i-1}$ | " | " |
| | 2 | " | " | $\Sigma_1$ | $PP_3$ | $\Sigma_1$ | " | " | " | " | " |
| | 3 | " | " | $\Sigma_2$ | $PP_4$ | $\Sigma_2$ | " | " | " | " | " |
| | 4 | " | " | $\Sigma_3$ | $PP_5$ | $\Sigma_3$ | " | " | " | " | " |
| | 5 | " | " | $Y2_i$ | $-k1b1_{i-1}$ | $-k1Y1_{i-1}$ | " | " | " | " | " |
| 19 | 1 | E | $I_{i-1}$ | $PP_1$ | $PP_2$ | $Y1_i$ | $Y1_i$ | $Y9_i$ | $Y10_i$ | " | " |
| | 2 | " | " | $\Sigma_1$ | $PP_3$ | $\Sigma_1$ | " | " | " | " | " |
| | 3 | " | " | $\Sigma_2$ | $PP_4$ | $\Sigma_2$ | " | " | " | " | " |
| | 4 | " | " | $\Sigma_3$ | $PP_5$ | $\Sigma_3$ | " | " | " | " | " |
| | 5 | " | " | 0 | $EI_{i-1}$ | $EI_{i-1}$ | " | " | " | " | " |
| 20 | 1 | k9 | $Y9_i$ | $PP_1$ | $PP_2$ | $EI_{i+1}$ | $EI_{i+1}$ | $Y8_i$ | $Y9_i$ | $b9_{i-1}$ | " |
| | 2 | " | " | $\Sigma_1$ | $PP_3$ | $\Sigma_1$ | " | " | " | " | " |
| | 3 | " | " | $\Sigma_2$ | $PP_4$ | $\Sigma_2$ | " | " | " | " | " |
| | 4 | " | " | $\Sigma_3$ | $PP_5$ | $\Sigma_3$ | " | " | " | " | " |
| | 5 | " | " | $b9_{i-1}$ | $k9Y9_i$ | $k9Y9_i$ | " | " | " | " | " |

For each T-time, the data output at the top of the K-stack 72, delay stack 54 (TAP 1), the one stage delay register 58 (TAP 2) and B-stack 52 are illustrated, in addition to the multiplicand that is utilized during the multiplication procedure. The two addends that are presented to the adder input for addition or subtraction operation are illustrated under the respective inputs labeled A and B. The summation output of the adder during each pass is illustrated under the "Σ" column. It should be understood that this summation value is not generated until the end of the $t_5$ cycle of the fast clock during a given T-time and it is present at the output of the adder during the next T-time. It is then clocked into the latch 108 at the end of time period $t_1$. On the next transition of the slow clock, the data is clocked into the B stack 52 and/or the delay stack 54.

Referring further to Table 3, the data flow through the system will be described in detail. During $T_1$, the number present at the top of the K stack 72 is the constant k8, the value present at the top of the one stage delay 58 (TAP2) is $Y8_{i-1}$ and the value present at the top of the B stack is the value of $b8_{i-2}$. In the first four cycles of the fast clock, $t_1-t_4$, the product $k8Y8_{i-1}$ is generated. In the fifth cycle of the fast clock $t_5$, the value of $b8_{i-2}$ from the B stack 52 is input to the A-input of the adder 44 and the product $k8Y9_{i-1}$ is input to the B-input thereof. At the end of the time period $t_5$ during $T_1$, the sum of $b9_{i-1}$ is generated and output from the adder 44. However, it does not appear until the initiation of $T_2$.

When the slow clock increments to T-time $T_2$, the value of $b9_{i-1}$ is loaded into the D-register 108. The value of $b8_{i-1}$ is then calculated during the T-time $T_2$. As described above, the contents of the D-register 108 are loaded into the B stack 52 and/or the delay stack 54 at the end of $t_1$ in each T-time. The remainder of the B-values are then calculated up to the value of $b2_{i-1}$ in $T_8$. After the value of $b2_{i-1}$ is calculated, it is loaded into the D-register 108 for subsequent loading into the bottom of the B stack 52 and the delay stack 54. In addition, the value of $Y1_{i-}$, which was present at the top of the delay stack 58, is loaded into the Y latch 110 and then the value of $Y10_i$ calculated in $T_9$. In accordance with Equation 1 of Table 1, the value of $Y10_i$ requires both the constant k10 and the delayed value of b10, in addition to the product of E and I. This product EI is previously stored in the B stack 52 and, during $T_9$, is present on top thereof. In addition, the value of $b10_{i-1}$ that was calculated in $T_1$ is present on top of the one stage delay stack 58, since nine clock cycles of the slow clock have occurred since calculation thereof.

After calculation of the value of $Y10_i$ the clock signal for the B stack 52 is inhibited such that the contents thereof remain constant and no further data is loaded therein. However, the delay stack 54 continues to be incremented and data loaded therein for calculation of the remaining Y-values $Y7_i-Y1_i$ corresponding to T-times $T_{10}-T_{18}$. During calculation of the value of $Y1_i$ during $T_{18}$, the multiplier 94 selects the contents of the Y latch 110 for the multiplicand, since $Y1_{i-1}$ is equal to $b1_{i-1}$. It should be noted that during T-time $T_9$ through $T_{18}$, the operation performed by the adder is a subtraction operation wherein the control signals for the multiplexers 122 and 128 of FIG. 4 are selected to provide a negative product for the multiplication step.

During T-time $T_{19}$, the B stack 52 has the value of $b10_{i-1}$ now present at the top thereof and the value of $Y10_i$ present on the top of the one stage delay stack 58. The multiplexer 94 is controlled to select the value of I rather than the value of $Y10_i$, to calculate the product $EI_{i+1}$. The multiplexer 62 is controlled to select a value of zero for input to the A input of the adder 44 for addition with the product $EI_{i+1}$. The result is therefore $EI_{i+1}$ which is loaded into both the delay stack 54 and the B stack 52. However, the product EI is not selected from the output of the delay stack 54. Therefore, it is merely discarded. In addition, the value for $Y10_i$ that is present on the top of the delay stage 58 is also discarded during $T_{19}$ since it is not needed as a multiplicand for the calculations. The value of $b10_i$ is then calculated during $T_{20}$ and the system begins the next sample time.

In summary, there has been provided a system for multiplexing the operation of a single full adder to perform both multiplication and addition or subtraction operations. A series of twenty Equations are calculated using multiplexers to multiplex the operation of the adder and delay stages to delay the calculated values for recirculation back into the input of the adder for subsequent calculations. Constants are stored in a separate circulating register to provide the multiplier for the multiplication operation. After the series of operations has been performed, the result is stored in a separate data register for processing with a D/A converter.

Although the preferred embodiment has been described in detail, it should be understood that various changes, substitutions and alterations can be made therein without departing from the spirit and scope of the invention as defined by the appended claims.

What is claimed is:

1. A digital lattice filter for performing a sequence of arithmetic operations each comprising a multiplication followed by an addition in accordance with a linear predictive coding voice compression technique, comprising:
    storage means for storing digital arithmetic parameters for use in performing the arithmetic operations;
    retrieval means for selectively retrieving from said storage means a predetermined one of said stored parameters as a multiplier, a multiplicand or an addend;
    adder means having first and second inputs and an output for receiving two values and generating the sum thereof on the output;
    multiplication means for receiving a multiplier and a multiplicand from said retrieval means and generating partial products and for interfacing with said adder means to sum the partial products to perform multiplication and generate a product in accordance with a predetermined multiplication algorithm;
    first control means for controlling said retrieval means and said multiplication means to retrieve selected ones of said stored multipliers and said stored multiplicands and generate a product;
    second control means for inputting said product after generation thereof to the first input of said adder means and controlling said retrieval means to retrieve a selected one of said stored addends for input to the second input of said adder means as an addend and controlling said adder to provide the sum thereof, the sum comprising an intermediate arithmetic result;
    means for controlling the operation of said first and second control means to control the sequence of multiplications and additions to perform a multiplication followed by an addition in a sequence in accordance with the linear predictive coding technique;
    means for storing each of the intermediate arithmetic results in said storage means in a predetermined order as arithmetic parameters; and
    means for storing as a final result the final arithmetic operation in the sequence.

2. The digital apparatus of claim 1 wherein said adder means comprises a full adder for providing the sum of two digital values.

3. The digital apparatus of claim 1 wherein said multiplication algorithm is a modified Booth's algorithm and said multiplication means comprises:
    means for generating partial products of said multiplier and multiplicand retrieved by said retrieval means;

means for inputting the first and second partial products to the first and second inputs of said adder means to generate the sum therefor; and means for inputting successive partial products to the first input of said adder means and the summed output of said adder means to the second input thereof to sequentially sum partial products to generate a product in accordance with said modified Booth's algorithm.

4. The digital apparatus of claim 1 wherein said means for storing the intermediate arithmetic results comprises:

stack means for arranging the stored arithmetic parameters in a predetermined order in said storage means; and timing means for controlling said stack means in synchronism with the performance of the arithmetic operation such that the one of the stored parameters corresponding with the arithmetic operation being performed is at the top of said stack means for retrieval thereof by said retrieval means.

5. The digital apparatus of claim 1 and further comprising means for externally altering the value of the arithmetic parameters that are stored in said storage means.

6. The digital apparatus of claim 1 and further comprising means for generating the negative value of said generated product output by said multiplication means for input to said adder means by said second control means.

7. A digital lattice filter for performing a sequence of arithmetic operations, each comprising a multiplication followed by an addition in accordance with a linear predictive coding technique, comprising:

first storage means for storing digital multiplier constants in a first-in first-out format;

second storage means for storing digital multiplicands for multiplication operations and digital addends for addition operations in a first-in first-out format;

queing means for controlling the position of data within said first and second storage means to output data therefrom in a predetermined queing sequence with respect to the arithmetic operation being performed;

a full adder having first and second inputs for receiving two digital values and generating the sum thereof on an output;

multiplication means for selectively retrieving a multiplier and a multiplicand from the outputs of said first and second storage means and interfacing with said full adder to generate and sum partial products in a predetermined sequence of summing operations with said full adder in accordance with a predetermined multiplication algorithm to perform a multiplication operation and generate a product for a given one of the arithmetic operations;

adder means for retrieving an addend from said second storage means and inputting it to one input of said full adder and simultaneously inputting said product generated by said multiplication means in said given arithmetic operation to the other input thereof to generate the sum therefor, the sum comprising the result of said given arithmetic operation;

operation means for controlling the operation of said multiplication and adder means to first generate a product and then add said retrieved addend to said product to provide the result for each arithmetic operation;

means for storing the results of each arithmetic operation in said second storage means after generation thereof as one of said addends or one of said multiplicands in accordance with the predetermined gueing sequence of said queing means for use in a subsequent one of the arithmetic operations;

timing means for controlling said operation means to sequentially perform each of the arithmetic operations in the sequence and for controlling said queing means to output data corresponding to the arithmetic operation being performed for use by said multiplication means and said adder means; and register means for storing as a final result the result of the last of the series of arithmetic operations in the sequence.

8. The apparatus of claim 7 wherein said multiplication means further comprises means for selectively generating a negative value for said product for input to said full adder by said adder means.

9. The apparatus of claim 7 wherein said first storage means comprises a first-in first-out stack of data registers.

10. The apparatus of claim 7 and further comprising means for altering the value of said constants in said first storage means.

11. The apparatus of claim 7 wherein said second storage means comprises:

first delay data register means for storing the results of preceding arithmetic operations as said multiplicands in a first-in first-out format to provide a delay therefor; and second delay data register means for storing the results of the preceding arithmetic operations as said addends in a first-in first-out format to provide a delay therefore.

12. The apparatus of claim 7 wherein said multiplication means comprises:

means for generating partial products of the multiplicand and multiplier;

means for inputting the first partial product to the first input of said adder and the second partial product to the second input of said adder to generate the partial product sum thereof; and means for sequentially inputting the summed output of said adder to the first input thereof and sequentially inputting the remaining partial products to the second input of said adder to form an accumulated sum of said partial products to generate the product of said multiplier and multiplicand.

13. The apparatus of claim 12 wherein said means for generating partial products generates partial products in accordance with a modified Booth's algorithm.

14. The apparatus of claim 7 wherein said timing means comprises:

means for generating a first time base to determine the duration for performing the entire sequence of arithmetic operations;

means for generating a second time base for determining the duration for performing each of the individual arithmetic operations; and means for generating a third time base to determine the duration of time to perform multiplication with said multiplication means and the duration of time to perform addition with said adder means, said multiplication and addition occurring during the time required for each of the arithmetic operations.

15. An apparatus for performing a sequence of arithmetic operations each comprising a multiplication followed by an addition, comprising:
   a full adder having first and second inputs and an output for receiving two digital values and generating the sum thereof to provide a summing operation;
   a system clock for generating system timing reference signals, said reference signals comprising a slow clock signal for determining the duration of time for performing each arithmetic operation and a fast clock signal for determining the duration of each summing operation of said full adder;
   a rotary data stack for storing predetermined multiplier constants in a predetermined order and incremented by said slow clock to sequentially output said multiplier constants on each cycle of said slow clock;
   first delay stack means having an input and an output with the input thereof selectively connected to the output of said adder for selectively storing the output therefrom as a multiplicand at the end of each arithmetic operation and outputting the stored multiplicand after a predetermined number of cycles of said slow clock;
   second delay stack means having an input and an output with the input thereof selectively connected to the output of said adder for selectively storing the output therefrom as an addend at the end of each arithmetic operation and outputting the stored addend after a predetermined number of clock cycles of said slow clock;
   said first and second delay stack means having a first-in first-out format;
   temporary data stack means for storing and delaying the results of an arithmetic operation as an addend for one cycle of said slow clock;
   multiplication means operating in accordance with a modified Booth's algorithm comprising:
      recode logic means for retrieving the top multiplier value in said rotary data stack in a given one of the arithmetic operations and generating Booth recode logic operators,
      means for retrieving the top multiplicand value in said first delay stack means and generating partial products in response to the generation of said Booth recode logic operators, and
      interface means for interfacing with said adder and adding said partial products with said adder to generate the product of said multiplier and multiplicand;
   adding means for selectively retrieving an addend from the output of either said temporary data stack means or said second delay stack means in accordance with a predetermined pattern and adding said retrieved addend to said product generated by said multiplication means in the given one of the arithmetic operations to provide a result for the given arithmetic operation; and
   a register for storing the result of the last arithmetic operation in the sequence, said register activated in response to the occurrence of a predetermined number of cycles of said slow clock that defines the length of the sequence.

16. The digital apparatus of claim 15 and further comprising means for changing the sign of said product to generate a negative product.

17. The apparatus of claim 15 and further comprising means for varying the data in said rotary data stack to provide different multiplier constants therefor.

18. A method for performing a sequence of arithmetic operations each comprising a multiplication followed by an addition in accordance with a linear predictive coding voice compression technique, comprising:
   storing digital arithmetic parameters as multiplier constants, multiplicands and addends for use in performing the arithmetic operations;
   selectively retrieving a predetermined one of the stored multipliers and a predetermined one of the multiplicands in accordance with the linear predictive coding technique;
   generating partial products of the retrieved multiplier and multiplicand in accordance with a predetermined multiplication algorithm;
   inputting the first and second partial products to the first and second inputs of a full adder to generate the sum therefor constituting the next successive partial product;
   inputting successive partial products to the inputs of the adder to sequentially sum partial products to provide a generated product in a given one of the arithmetic operations;
   inputting the generated product into one input of the full adder in the given arithmetic operation;
   retrieving a predetermined one of the stored addends and inputting it to the second input of the full adder to provide the sum of the retrieved addend with the generated product to provide a result of the given arithmetic operation;
   performing the addition and multiplication operations in each of the arithmetic operations in the sequence in accordance with the linear predictive coding technique;
   storing the results of the arithmetic operations as digital arithmetic parameters as either multiplicands or addends in accordance with the linear predictive coding technique; and
   storing the result of the final arithmetic operation in the sequence in a dedicated register.

19. The method of claim 18 and further comprising generating the negative of the product such that a subtraction operation can be performed.

20. The method of claim 18 and further comprising externally altering the stored arithmetic parameters to provide new values therefor.

* * * * *